United States Patent [19]

Woods

[11] 4,057,824
[45] Nov. 8, 1977

[54] P+ SILICON INTEGRATED CIRCUIT INTERCONNECTION LINES

[75] Inventor: Murray Henderson Woods, Princeton, N.J.

[73] Assignee: RCA Corporation, New York, N.Y.

[21] Appl. No.: 682,148

[22] Filed: Apr. 30, 1976

[51] Int. Cl.² .............. H01L 27/12; H01L 29/78; H01L 29/34; H01L 29/06
[52] U.S. Cl. ............................ 357/56; 357/4; 357/23; 357/54; 357/59; 357/68
[58] Field of Search .............. 357/4, 23, 54, 56, 59, 357/68

[56] References Cited

U.S. PATENT DOCUMENTS

| | | | |
|---|---|---|---|
| 3,749,610 | 7/1973 | Swann et al. | 357/54 |
| 3,764,413 | 10/1973 | Kakizaki et al. | 357/54 |

FOREIGN PATENT DOCUMENTS 1,069,506  5/1967  United Kingdom ............... 357/4

Primary Examiner—Edward J. Wojciechowicz
Attorney, Agent, or Firm—H. Christoffersen; R. P. Williams

[57] ABSTRACT

An improved interconnecting line for an integrated circuit comprising a P+ silicon island having an optional first layer of silicon dioxide or a like material thereon and a second layer of silicon nitride or a like material adjacent the first layer, is provided. The line may be manufactured by improvements in the standard P channel MOS or MNOS processing method wherein the line is formed concomitantly with the island upon definition of the silicon. The line may be subsequently coated with silicon dioxide during formation of a gate oxide for a MNOS device and then coated with silicon nitride.

14 Claims, 6 Drawing Figures

P+ SILICON INTEGRATED CIRCUIT INTERCONNECTION LINES

The Government has rights in this invention pursuant to Contract No. F33615-75-C-1109 awarded by the Department of the Air Force.

This invention relates to semiconductor integrated circuit devices of the type which are made in thin, layerlike bodies or islands of semiconductive material on insulating substrates. More specifically, the invention relates to thin, layer-like strips, i.e. lines or islands, of semiconductive material on an insulating substrate which are used to interconnect integrated circuit devices, and to a method for making said strips, lines, or islands.

The invention may be used in most all integrated circuit manufacturing processes wherein a semiconductive material is formed on an insulating substrate. The interconnecting strips of the invention and the method for making said strips are particularly useful in the MOS (metal-oxide-semiconductor), MNOS (metal-nitride-oxide-semiconductor), and CMOS (complementary-metal-oxide-semiconductor) manufacturing processes wherein heteroepitaxial silicon semiconductive material is formed on an insulating sapphire substrate, hereinafter referred to as the "SOS" process.

Semiconductive strips formed on insulating substrates which are doped with N conductivity modifiers and subsequently covered with an oxide layer are known. Moreover, the placement of a layer of silicon on a substrate and a layer of silicon dioxide adjacent a P silicon semiconductive layer and a deposition of a layer of silicon nitride adjacent the layer of silicon dioxide wherein the silicon layer is moderately doped is known from MNOS processing wherein the silicon dioxide and silicon nitride layers are located above a charge carrier channel.

It is also known to deposite N epitaxial silicon on an insulating substrate such as sapphire and to define a portion of the N silicon for use as an interconnecting strip in the manufacture of CMOS integrated circuits. See U.S. Pat. No. 3,749,614 issued to Boleky III and Scott, Jr.

Integrated circuits require interconnection of the various transistor devices by some means. Silicon-on-sapphire insulated gate field effect integrated transistors are often interconnected by means of strips of silicon defined from silicon deposited on the sapphire substrate. Heretofore interconnecting strips for integrated circuits manufactured on insulating substrates have used N+ doping instead of P+ doping because N impurities provided LOWER resistivities. Typically, N+ doping in SOS layers results in resistivities of about 50 ohms per square whereas the same layers doped P+ have resistivities on the order of 100 to 150 ohms per square. Thus, as known, when an MOS transistor is driven through a silicon strip or interconnecting line, a speed advantage factor of 2 to 3 is gained by using N+ instead of P+ strips for the same geometry line.

A reason for the speed advantage of N+ over P+ is the use of boron as a P impurity dopant. When P+ boron-doped interconnecting lines are made and covered with silicon dioxide, the boron segregates into subsequently formed silicon dioxide. The silicon dioxide is formed during subsequent oxidation steps wherein the gate oxide and a protective oxide are typically formed on the transistors and strips making up the integrated circuit. A similar segregation does not occur for N+ lines and strips used for interconnecting the transistors because an N dopant, phosphorous, used in the manufacture of N+ lines segregates into the silicon during subsequent oxidation steps instead of into the subsequently formed oxides on the silicon strip. These facts create a problem when P+ lines are desired.

The invention is directed to this problem and presents an interconnecting strip wherein when doped with boron, a covering oxide is eliminated or segregation of the boron into a subsequently formed oxide is substantially reduced, and wherein by use of novel process for making the present invention P+ boron-doped interconnecting strips have resistivities of 50 ohms per square and below are made.

In the drawings:

FIG. 6 is a cross-section of FIG. 2 taken along the line 6—6.

Figure 1:
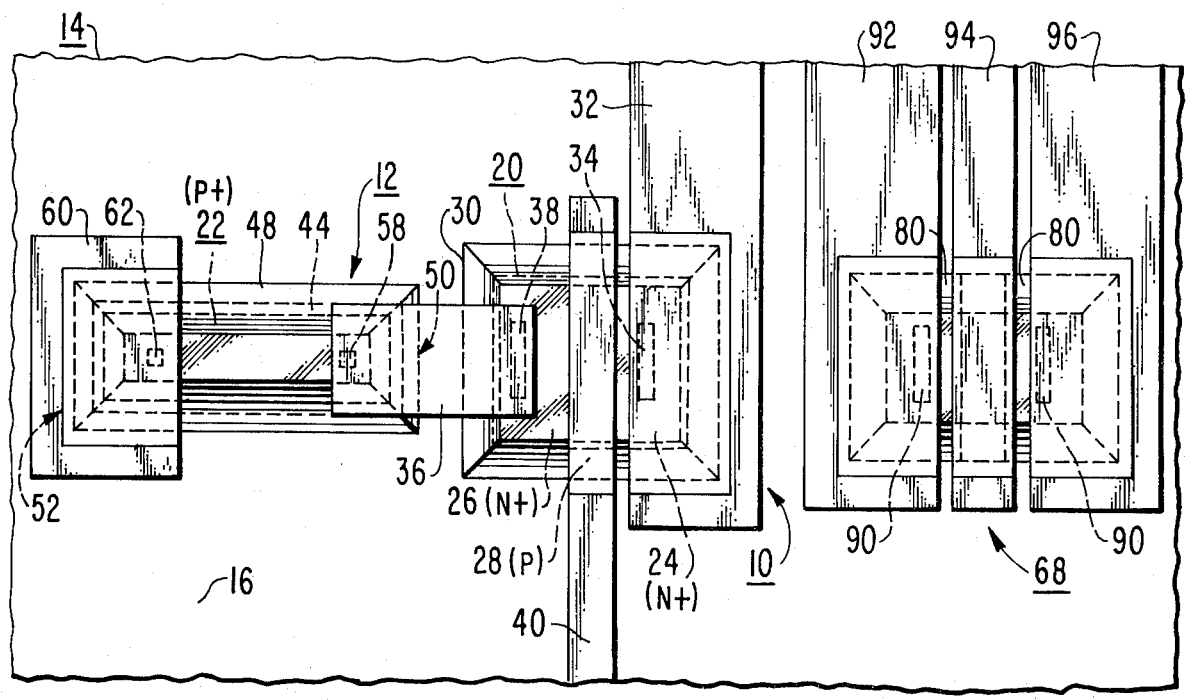
FIGS. 1 and 2 are top views of preferred embodiment of the invention.

An active transistor 10 is shown in combination with an interconnecting strip 12 in FIG. 1. The interconnecting strip 12 is shown in combination with an insulating substrate 14 supporting said strip 12 and the transistor 10. The substrate 14 is typically a monocrystalline insulating material such as sapphire, chrome doped gallium arsenide, or spinel. The substrate 14 has a surface 16 on which a layer of single crystal semiconductive material can be grown.

The transistor 10 includes a body 20 of semiconductive material which is on and epitaxially related to the substrate 14. Similarly, the interconnecting strip 12 includes a body 22 of semiconductive material on and epitaxially related to the substrate 14. The bodies 20 and 22 each have the same initial type of conductivity and the same initial amount of conductivity modifiers. In this invention, the conductivity of the bodies 20 and 22 are initially either P or N.

The transistors 10 further comprises a spaced source 24 (N+) and drain 26 (N+) in the body 20 comprised of heavily N doped regions for example, and defining between them a charge carrier channel 28 (P) moderately doped P. The body of semiconductive material 20 is coated with a layer of insulating material 30 which preferably has a thickness and composition suitable for use as the gate insulator of the device. A source electrode 32 extends through an opening 34 in the oxide coating 30 into contact with the source 24 (N+). A drain electrode 36 extends through an opening 38 in the oxide coating 30 into contact with the drain 26 (N+). A gate electrode 40 of a suitable conductive material overlies the insulating coating 30 adjacent the charge carrier channel 28 (P).

The interconnecting strip 12 further comprises P conductivity modifiers and in this example the semiconductive body 22 is comprises of silicon and the P type conductivity modifiers are present in such quantities that the body 22 is considered moderately doped P+. The body 22 of semiconductive material is coated with a first layer 44 of insulating material which preferably is silicon dioxide and which preferably has a thickness which is less than 100 angstroms and need not be present at all. The layer 44 of insulating material is coated with a subsequent layer 48 of insulating material which is a means for preventing further oxidation of the body 22. The layer 48 is also selected to prevent any substantial out diffusion of P type dopants, typically boron, from the semiconductive body 22 into the thin layer of insulating material 44. Preferably, the layer 48 of insulating material is silicon nitride, however, any insulating material having like properties may be utilized. The insulating material 48 when silicon nitride typically has a thickness of from 400 to 450 angstroms.

Alternatively, the oxide layer 44 may be eliminated and the silicon body 22 covered immediately or directly with the layer 48. In this circumstance, no out diffusion from the silicon body 22 is possible and the layer 48 serves only as a means for preventing oxidation of the body 22.

A first end 50 of the interconnecting strip 12 in FIG. 1 is located adjacent a drain 26 (N+) of the transistor 10 in this example. The strip 12 is located adjacent the drain 26 (N+), wherein it is connected thereto via the drain electrode 36.

A second end 52 of the interconnecting strip 12 is located adjacent an edge of the substrate 14 in this example as shown in FIG. 1. The end 50 is used to connect the strip 12 to the transistor 10. The drain electrode 36 of the transistor 10 is extended to connect to the end 50. The electrode 36 extends through an opening 58 in the coatings 44 and 48 into contact with the body 22. A metal contact 60 adjacent end 52 of the strip 12 extends through an opening 62 in the layers 44 and 48 into contact with the body 22. The contact 60 in this example is used to interconnect the drain 26 (N+) of the transistor 10 to exterior connectors, an outside circuit, or to another transistor.

Figure 2:
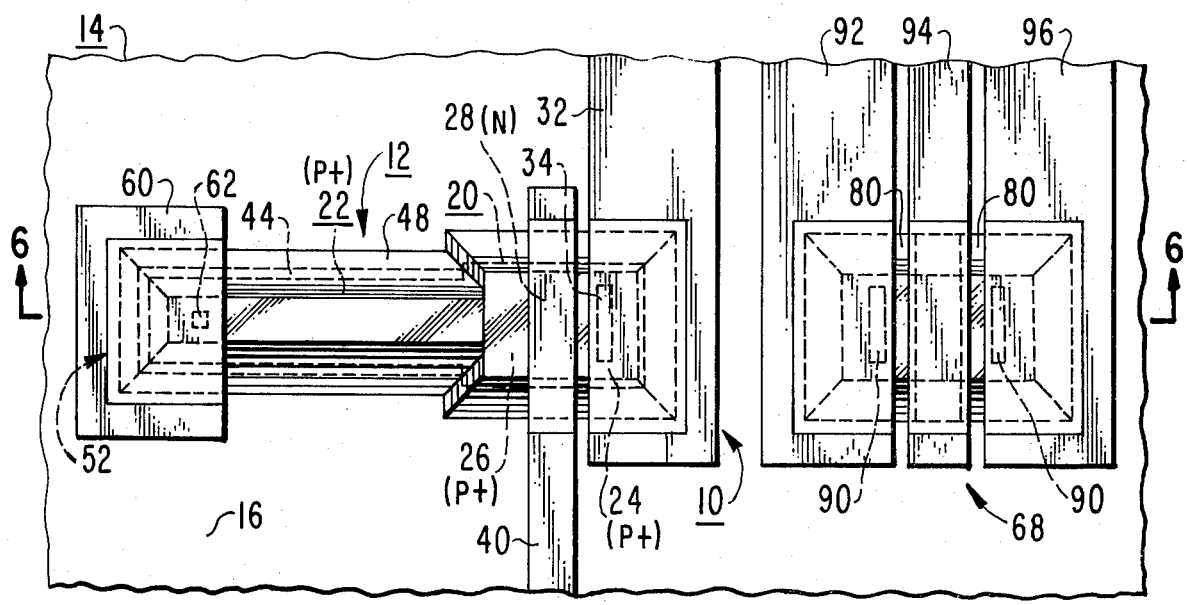
Figure 3:
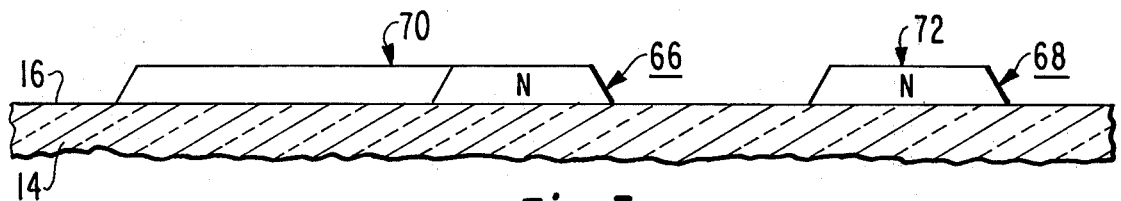
FIGS. 3-6 are partial cross-sections illustrating steps in the present novel method.
Figure 6:
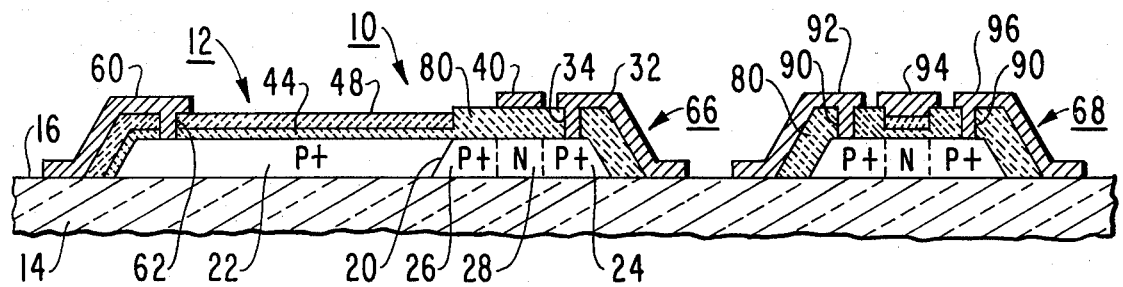

In FIG. 2 is shown another embodiment of the present invention wherein the semiconductor body 22 is connected directly to the drain 26 (P+) for example. A cross-section along the line 6—6 of the embodiment in FIG. 2 is shown in FIG. 6. The semiconductor body 20 and the semiconductor body 22 are coextensive and formed in a single etching process, for example. This embodiment is particularly adaptable to manufacture using P channelMOS processing technology because the semiconductor body 22 of the interconnecting strip 12 is doped P+ in the same operation used for doping the source 24 (P+) and drain 26 (P+).

FIGS. 3–6 illustrate steps in a method for manufacturing the present novel device as shown in FIG. 2, for example. The transistor 10 and interconnecting strip 12 (of FIG. 2) are preferably made with a starting wafer or substrate 14 of a material such as sapphire which will promote the epitaxial growth of silicon. A surface 16 of the substrate 14 is oriented substantially parallel to the ($1\bar{1}02$) crystallographic plane in the sapphire and a layer of substantially N-type silicon is grown thereon and selectively shaped by suitable means such as etching into mesas or islands 66 and 68, for example. The ($1\bar{1}02$) surface orientation of the sapphire will cause the silicon to grow in the direction of the [100] silicon axis such that the top noncontiguous surfaces 70 and 72 of the islands 66 are 68 are parallel to the (100) crystallographic planes of the silicon. The conditions during growth should be adjusted so that the silicon is doped to a level on the order of $10^{15}$ atoms/cm$^3$. This epitaxial growth step is generally known and may be done by the thermal decomposition of silane (SiH$_4$). A small amount of phosphine (PH$_3$) may be added, if desired, to the growth atmosphere to dope the silicon N-type.

A thin layer of silicon oxide (not shown) is next formed on the noncontiguous surfaces 70 and 72 of the silicon islands 66 and 68, respectively, and defined using a standard photolithographic technique such that masks 74 and 76 are placed on the portions of the islands 66 and 68, respectively, which are to be used to form an active driver transistor and a memory transistor. The masks 74 and 76 are each used to define a region which extends across each of the islands whereby each region is used as a charge carrier transit channel. For example, the masks 74 and 76 may be etched from a layer of silicon oxide formed by heating the substrate 14 and the islands 66 and 68 thereon to a temperture of about 875° C for a period of about 15 minutes in an oxidizing atmosphere comprising steam and a small amount of gaseous hydrogen chloride. This results in a clean silicon oxide layer (not shown) having a thickenss of about 250 angstroms.

Figure 4:
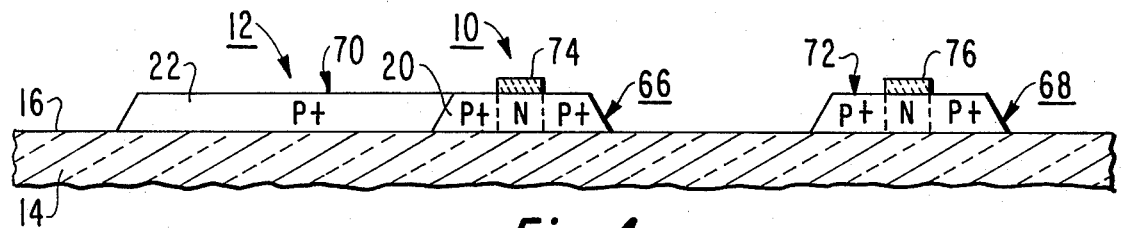

The wafer having the configuration shown in FIG. 4 is subjected to a means for doping the regions of the semiconductor islands 66 and 68 which are not covered by the masks 74 and 76 with P impurities to form a net P+ concentration for the uncovered regions. Such means may comprise placing the wafer in an ion implantation appparatus and accelerating ions into the islands 66 and 68 until the regions not covered by the masks 74 and 76 are doped with P type ions to a concentration of approximately $10^{19}$ atoms/cc.

Gaseous diffusion is another means by which the unmasked region comprised of semiconductor body 22 and 20 may be doped P+. The P+ is driven in by a gaseous boron nitride diffusion at 1,000° C for approximately 15 minutes in nitrogen. A deposited heavily P doped silicon oxide layer 1500A thick covered with an undoped silicon dioxide layer about 1500A thick may also be used for a solid-to-solid diffusion step.

The masks 74 and 76 shown in the wafer in FIG. 4 are removed and subsequent processing steps are used to convert the island 68 into an MNOS device, the semiconductor 20 of the island 66 into an MOS transistor and the semi-conductor body 22 of the island 66 into an interconnecting strip 12 which extends the drain 26 of the transistor 10 in the vicinity of an edge of the substrate 14.

Next, a second layer 44 of silicon oxide is again formed on the noncontiguous surfaces of the silicon islands 66 and 68. (See FIG. 5) The second layer 44 is formed substantially in the manner described by heating the substrate 14 and the layer and the islands 66 and 68 thereon to a temperature of about 875° for a period of about 10 minutes in an oxidizing atmosphere comprising steam and a small amount of gaseous hydrogen chloride. This results in the clean silicon layer 44 having a thickness of about 100A.

Figure 5:
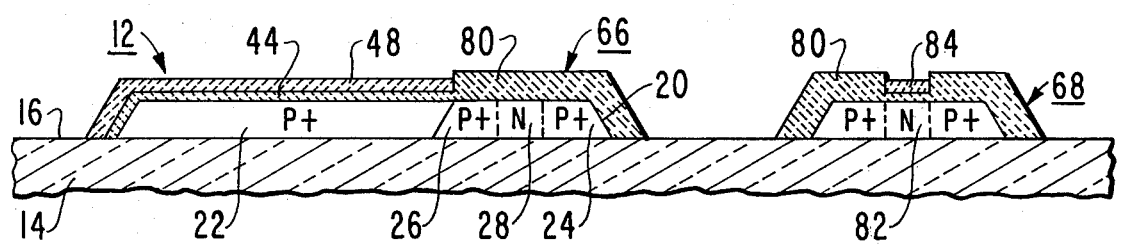

The wafer is next covered with a layer of silicon nitride (not shown) which is subsequently defined by a standard photolithographic technique into an insulating layer 48 adjacent the previously grown insulating coating layer 44 for the body 22. See FIG. 5. Another silicon nitride region 84 is defined adjacent the oxide over the channel 82 of island 68. The interconnecting strip 12, as shown in FIG. 5, is now complete and only the subsequent steps necessary to transform the body 20 and the island 68 into transistors remain to be performed.

In FIG. 5 the wafer is again oxidized and a layer 80 of silicon oxide is formed by heating the substrate 14 with the islands 66 and 68 thereon to a temperature of about 875° C for a period of about 45 minutes in an oxidizing atmosphere comprising steam and a small amount of gaseous hydrogen chloride. This results in a clean silicon oxide layer 80 on the silicon islands 66 and 68 having a thickness of approximately 1000A.

During formation of the layer 80, the silicon nitride layer 48 and the silicon nitride region 84 prevent further oxidation of the silicon body 22 and channel 82, respectively. Both the thickness of the oxide over the channel 82 and the thickness of the layer 44 remains unchanged. Thus, the silicon dioxide available for absorbing or taking up the P impurities previously placed in the body 22 is limited by the layer 48. Some processes may make it practical to place the silicon nitride layer 48 directly adjacent the body 22 without the thin layer 44 of oxide therebetween. In this circumstance, an oxide formation such as layer 44 is completely prevented and there is no out diffusion of the P impurities from the silicon body 22.

Contact holes 34 and 62 illustrated in FIG. 2 and shown in cross-section along line 6—6 in FIG. 6, are next opened in the layers covering the island 66 and contact holes 90 are opened in the layers covering the island 68. The contact holes are opened by a standard photolithographic technique. Subsequently, the wafer is placed in a continuous vapor deposition chamber and a layer of a metal such as aluminum is deposited over the entire surface. Again using a standard photolithographic technique the metalized layer is etched, for example, and the contacts and metal gates 32, 40, 60, 92, 94 and 96 shown in FIG. 6 are formed. The contact 60 is in contact with the semiconductor body 22 of the interconnecting strip 12 and as such is an exterior contact for the drain 26 (P+). The metal layer also forms the gate contacts for the device 10 and the device formed by the island 68. Contact 32 extends through the layer 80 and contacts the source 24 of the device 10.

During the deposition of the metal layer which forms the contacts, the wafer and the islands 66 and 68 are raised to a temperature of approximately 750° C for approximately 5 minutes. A portion of the boron dopant forming the P+ concentration of the body 22 may also be diffused into the layer 44 of silicon oxide during this subsequent heat step. However, subsequent oxidation of the interconnecting strip 12 is again prevented by the layer 48 of silicon nitride. In addition, because of the thinness of layer 44 relative to the thickness of the body 22 the amount of boron which is able to diffuse into the layer 44 is limited by a decrease in solubility of boron in the silicon oxide as more boron is added, i.e., the body 22 once doped P+ at a concentration of approximately $10^{19}$ atoms/cc remains substantially at this concentration because of the diminished capacity of the thin layer 44 of silicon dioxide to continue to absorb boron atoms once an initial heat treatment is performed. The silicon nitride layer 48 does not absorb boron from the silicon and yet prevents any further growth of the layer 44.

Once the semiconductor bodies 20, 22, and 68 are established on the substrate 14, the semiconductor body 22 has been doped P+ to a concentration of approximately $10^{19}$ atoms/cc and the layers 44 and 48 have been formed to provide a coating thereon, conventional processes may be applied to form the transistor 10 and a transistor from the island 68.

While the above description has been in terms of producing generic N and P MOS transistors 10 in an integrated circuit comprising an aluminum gate MNOS memory device using SOS processing, it will be understood by those of ordinary skill that both deep depletion and enhancement transistors can be made using either a P or an N epitaxial layer. In the case of the P epitaxial layer, the semiconductor body 22 is typically formed separate and apart from the transistor 10. And, although the preferred embodiment has been presented and experimental data obtained with boron as a P-type impurity or dopant, other known P impurities which are physio-chemical equivalents of boron are within the purview of this novel invention.

What is claimed is:

1. In combination with a plurality of heteroepitaxial silicon mesa devices on a common substrate, at least one of said mesa devices comprising a first doped region and a second differently doped region, an improvement comprising:
   a means for interconnecting one of said regions of said at least one mesa device to another of said mesa devices, said means comprising a P+ silicon region having a first insulating coating thereon and a second insulating coating means for preventing oxidation of said P+ silicon region, said second insulating coating being located adjacent said first insulating coating.

2. The improvement recited in claim 1 wherein the first insulating coating is comprised of silicon dioxide.

3. The improvement recited in claim 2 wherein the second insulating coating is comprised of silicon nitride.

4. The improvement recited in claim 3 wherein said P+ silicon region is comprised of heteroepitarially grown single crystal silicon.

5. The improvement recited in claim 4 wherein said first region is comprised of N semiconductor material and wherein said second region is comprised of P semiconductor material.

6. The improvement recited in claim 5 wherein the P+ silicon region is connected to said second region.

7. In combination with a plurality of silicon semiconductor mesa devices on a common substrate at least one of said mesa devices comprising a source region and a drain region separated by a channel region, an improvement comprising:
   a means for interconnecting one of said regions of said at least one device to another of said devices, said means comprising a P+ silicon region having a first insulating coating thereon and a second insulating coating for preventing oxidation of the P+ silicon region, said second insulating coating being located adjacent the first insulating coating.

8. The improvement as recited in claim 7 wherein said first insulating coating is comprised of silicon dioxide.

9. The improvement recited in claim 8 wherein said second insulating coating is comprised of silicon nitride.

10. The improvement recited in claim 9 wherein said P+ silicon region is comprised of heteroepitaxial single crystal silicon.

11. The improvement recited in claim 10 wherein said source region and said drain region are both comprised of P+ silicon.

12. The improvement recited in claim 11 wherein the first said P+ silicon region is connected directly to the P+ source region.

13. The improvement recited in claim 11 wherein said P+ silicon region is connected directly to the P+ drain region.

14. A process for making a P+ doped low resistance interconnection between a plurality of heteroepitaxial silicon integrated circuit elements formed on an insulating substrate comprising the steps of:
   a. forming a P+ doped interconnecting strip between said elements;
   b. coating the strip with an insulating coating; and
   c. coating the insulating coating with means for preventing substantial out-diffusion of P impurities from the silicon strip.

* * * * *